United States Patent
Gopal Krishnan et al.

(10) Patent No.: US 11,735,680 B2
(45) Date of Patent: Aug. 22, 2023

(54) TIME OF FLIGHT (TOF) SENSOR WITH TRANSMIT OPTIC PROVIDING FOR REDUCED PARALLAX EFFECT

(71) Applicant: STMicroelectronics (Research & Development) Limited, Marlow (GB)

(72) Inventors: Thineshwaran Gopal Krishnan, Edinburgh (GB); Roy Duffy, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 142 days.

(21) Appl. No.: 17/172,636

(22) Filed: Feb. 10, 2021

(65) Prior Publication Data
US 2021/0167240 A1 Jun. 3, 2021

Related U.S. Application Data

(62) Division of application No. 16/401,209, filed on May 2, 2019, now Pat. No. 10,950,743.

(51) Int. Cl.
| | |
|---|---|
| *H01L 31/107* | (2006.01) |
| *G02B 27/30* | (2006.01) |
| *G01S 17/89* | (2020.01) |
| *F21V 8/00* | (2006.01) |
| *G02B 27/09* | (2006.01) |

(52) U.S. Cl.
CPC .......... *H01L 31/107* (2013.01); *G01S 17/89* (2013.01); *G02B 6/0053* (2013.01); *G02B 27/0972* (2013.01); *G02B 27/30* (2013.01)

(58) Field of Classification Search
CPC ... G01S 17/89; G02B 6/0053; G02B 27/0972; G02B 27/30; H01L 31/107
See application file for complete search history.

(56) References Cited

U.S. PATENT DOCUMENTS

| | | | |
|---|---|---|---|
| 2,831,453 A | 4/1958 | Hardesty | |
| 3,895,856 A * | 7/1975 | Bickel | G02B 5/12 359/534 |
| 4,874,228 A | 10/1989 | Aho et al. | |
| 5,291,038 A | 3/1994 | Hanamoto et al. | |
| 5,396,350 A * | 3/1995 | Beeson | G02B 6/0053 359/251 |

(Continued)

FOREIGN PATENT DOCUMENTS

JP 2004134223 A 4/2004

*Primary Examiner* — Jay C Kim
(74) *Attorney, Agent, or Firm* — Crowe & Dunlevy

(57) ABSTRACT

A transmit integrated circuit includes a light source configured to generate a beam of light. A receive integrated circuit includes a first photosensor. A transmit optic is mounted over the transmit and receive integrated circuits. The transmit optic is formed by a prismatic light guide and is configured to receive the beam of light. An annular body region of the transmit optic surrounds a central opening which is aligned with the first photosensor. The annular body region includes a first reflective surface defining the central opening and further includes a ring-shaped light output surface surrounding the central opening. Light is output from the ring-shaped light output surface in response to light which propagates within the prismatic light guide in response to the received beam of light and which reflects off the first reflective surface.

29 Claims, 4 Drawing Sheets

(56) References Cited

U.S. PATENT DOCUMENTS

| | | | |
|---|---|---|---|
| 6,755,556 B2 | 6/2004 | Gasquet et al. | |
| 6,835,923 B2 | 12/2004 | Hamalainen et al. | |
| 7,046,344 B2 | 5/2006 | Yamamoto et al. | |
| 7,121,744 B2 | 10/2006 | Yamauchi et al. | |
| 7,309,855 B2 | 12/2007 | Nagasaka et al. | |
| 7,452,114 B2 | 11/2008 | Gasquet | |
| 7,453,079 B2 | 11/2008 | Sano | |
| 7,500,774 B2 | 3/2009 | Nishiyama et al. | |
| 7,648,256 B2 * | 1/2010 | Shiratsuchi | F21V 5/008 362/268 |
| 7,714,265 B2 | 5/2010 | Fadell et al. | |
| 7,837,349 B2 * | 11/2010 | Chinniah | F21S 43/14 362/244 |
| 7,874,703 B2 * | 1/2011 | Shastry | G02B 19/0028 362/311 |
| 8,053,800 B2 | 11/2011 | Horio | |
| 8,075,165 B2 * | 12/2011 | Jiang | F21K 9/64 362/308 |
| 8,220,975 B2 * | 7/2012 | Miyashita | F21V 5/045 362/327 |
| 8,226,283 B2 * | 7/2012 | Gebauer | F21V 7/0091 362/522 |
| 8,305,561 B2 | 11/2012 | Mori et al. | |
| 8,330,945 B2 | 12/2012 | Choi et al. | |
| 8,476,814 B2 * | 7/2013 | Ibi | H01J 61/86 313/113 |
| 8,507,863 B2 | 8/2013 | Holenarsipur | |
| 8,712,485 B2 | 4/2014 | Tam | |
| 8,716,665 B2 | 5/2014 | Yao et al. | |
| 8,716,722 B2 | 5/2014 | Peng | |
| 8,766,195 B2 | 7/2014 | Tang et al. | |
| 8,780,447 B2 * | 7/2014 | Takagi | G02B 27/0172 359/633 |
| 8,805,302 B2 | 8/2014 | Pantfoerder | |
| 8,836,920 B2 | 9/2014 | Li | |
| 8,944,642 B2 * | 2/2015 | Kuo | G02B 19/0061 362/309 |
| 8,957,380 B2 | 2/2015 | Costello et al. | |
| 8,969,842 B2 | 3/2015 | Minamikawa | |
| 8,988,664 B2 | 3/2015 | Suzuki et al. | |
| 8,996,082 B2 | 3/2015 | Tam | |
| 9,151,829 B2 | 10/2015 | Campbell | |
| 9,182,538 B2 * | 11/2015 | Sakai | G02B 6/0016 |
| 9,256,007 B2 * | 2/2016 | Vasylyev | G03B 21/208 |
| 9,274,266 B2 * | 3/2016 | Ford | G02B 3/0037 |
| 9,291,495 B2 | 3/2016 | Land et al. | |
| 9,383,499 B2 * | 7/2016 | Takatori | G02F 1/133615 |
| 9,389,367 B2 * | 7/2016 | Yuan | G02B 6/0031 |
| 9,449,955 B2 | 9/2016 | Tu et al. | |
| 9,465,442 B2 | 10/2016 | Rai et al. | |
| 9,590,129 B2 | 3/2017 | Deliwala et al. | |
| 9,647,178 B2 | 5/2017 | Tu et al. | |
| 9,664,556 B2 | 5/2017 | Chu et al. | |
| 9,733,357 B2 | 8/2017 | Costello et al. | |
| 9,810,403 B2 * | 11/2017 | Wang | F21V 5/045 |
| 9,829,689 B2 * | 11/2017 | Hukkanen | G02B 3/08 |
| 9,857,034 B2 * | 1/2018 | Aslanov | F21K 9/60 |
| 9,869,450 B2 * | 1/2018 | Pickard | F21V 9/38 |
| 9,946,069 B2 * | 4/2018 | Valera | G02B 6/0056 |
| 10,060,850 B2 | 8/2018 | Yamamoto et al. | |
| 10,097,264 B2 | 10/2018 | Venugopalan Nair Jalakumari et al. | |
| 10,120,066 B2 | 11/2018 | Yang et al. | |
| 10,126,462 B2 | 11/2018 | Luan | |
| 10,132,929 B2 | 11/2018 | Albert et al. | |
| 10,191,245 B2 | 1/2019 | Kitamori et al. | |
| 10,199,407 B2 | 2/2019 | Kokubun | |
| 10,222,475 B2 | 3/2019 | Pacala et al. | |
| 10,365,489 B2 * | 7/2019 | Sekiguchi | G02B 6/0053 |
| 10,379,317 B2 | 8/2019 | Shimokawa et al. | |
| 10,393,874 B2 | 8/2019 | Schmidtke et al. | |
| 10,396,783 B2 | 8/2019 | Chan | |
| 10,416,454 B2 * | 9/2019 | Schmidtlin | G02B 27/30 |
| 10,436,935 B2 | 10/2019 | Gimpel et al. | |
| 10,437,099 B2 * | 10/2019 | Wang | G02F 1/133606 |
| 10,438,987 B2 | 10/2019 | Mandai et al. | |
| 10,468,543 B2 | 11/2019 | Wang et al. | |
| 10,475,937 B1 | 11/2019 | Jones et al. | |
| 10,593,823 B2 | 3/2020 | Utsumi et al. | |
| 10,760,951 B2 | 9/2020 | Bang et al. | |
| 10,809,358 B2 | 10/2020 | Becker et al. | |
| 2007/0210267 A1 | 9/2007 | Ishii et al. | |
| 2010/0032005 A1 * | 2/2010 | Ford | H01L 31/0543 136/246 |
| 2011/0096553 A1 * | 4/2011 | Shimokawa | G02B 19/0028 362/311 |
| 2012/0099310 A1 | 4/2012 | Kropac et al. | |
| 2012/0154672 A1 | 6/2012 | Yamazaki et al. | |
| 2014/0061447 A1 | 3/2014 | Campbell et al. | |
| 2014/0223734 A1 | 8/2014 | Song et al. | |
| 2014/0340302 A1 | 11/2014 | Sengupta et al. | |
| 2016/0182891 A1 | 6/2016 | Ko et al. | |
| 2017/0077166 A1 | 3/2017 | Kitamori et al. | |
| 2017/0191020 A1 | 7/2017 | Recht et al. | |
| 2017/0263793 A1 | 9/2017 | Ueno et al. | |
| 2017/0276870 A1 | 9/2017 | Snyman | |
| 2018/0038945 A1 | 2/2018 | Zhuang et al. | |
| 2018/0292512 A1 | 10/2018 | Gimpel et al. | |
| 2019/0259902 A1 | 8/2019 | Shimizu | |
| 2019/0293765 A1 | 9/2019 | Jeong et al. | |

* cited by examiner

TIME OF FLIGHT (TOF) SENSOR WITH TRANSMIT OPTIC PROVIDING FOR REDUCED PARALLAX EFFECT

CROSS REFERENCE TO RELATED APPLICATION

This application is a divisional of United States application for patent Ser. No. 16/401,209, filed May 2, 2019, the disclosure of which is incorporated by reference.

TECHNICAL FIELD

The present invention generally relates to a time of flight (TOF) sensor and, in particular, to a transmit optic for use in a TOF sensor.

BACKGROUND

A time of flight (TOF) sensor is well known to those skilled in the art. FIG. 1 presents a cross-sectional view of a typical prior art TOF sensor 10. The sensor includes a support substrate 12 which may include interconnection wiring 14, 16, 18 that is embedded within the substrate 12 and further located on the front surface 20 and rear surface 22 of the substrate. The wiring 16 within the substrate serves to interconnect the wiring 14 on the front surface 20 to the wiring 18 on the rear surface 22. A transmitter integrated circuit chip 30 is mounted to the front surface 20 of the substrate 12 and electrically connected to the wiring 14 (using bonding wires or other electrical connection means well known to those skilled in the art). The transmitter integrated circuit chip 30 includes a light source 32 (for example, a vertical-cavity surface-emitting laser (VCSEL)). A receiver integrated circuit chip 34 is also mounted to the front surface 20 of the substrate 12 and electrically connected to the wiring 14 (using bonding wires or other electrical connection means well known to those skilled in the art). The receiver integrated circuit chip 34 includes a first photosensor 36 and a second photosensor 38. The photosensors 36, 38 may, for example, each comprise an array of single-photon avalanche diodes (SPADs). The first photosensor 36 functions as a reference signal detector and the second photosensor 38 functions as an object signal detector. The integrated circuit chips 30 and 34 are enclosed in an opaque housing 40 that is mounted to the front surface 20 of the substrate 12. The housing 40 includes a transmit optic 42 (for example, a transparent glass plate) aligned with the light source 32 and a receive optic 44 (for example, a transparent glass plate) aligned with the second photosensor 38. A central partition 46 of the housing 40 is positioned between the first photosensor 36 and the second photosensor 38 to function as a light isolation barrier.

Operation of the TOF sensor 10 involves triggering the emission of a pulse of light by the light source 32. A first portion 50 of the emitted light passes through the transmit optic 42 and is directed toward an object 52. A second portion 54 of the emitted light is reflected by an inner surface of the housing 40 and is detected by the first photosensor 36. The first portion 50 of the emitted light reflects from the object 52, and the reflected light 56 passes through the receive optic 44 and is detected by the second photosensor 38. The difference in time between the detection of the second portion 54 by the first photosensor 36 and the detection of the reflected light 56 by the second photosensor 38 is indicative of the distance d between the TOF sensor 10 and the object 52.

TOF sensors having the configuration as generally shown in FIG. 1 suffer from a number of problems as illustrated by FIG. 2. The TOF sensor possesses a transmit field of view 60 for the light source 32 and the transmit optic 42 and a receive field of view 62 for the second photosensor 38 and the receive optic 44. One problem relates to parallax. Parallax is introduced by the separation distance s between the transmit optic 42 and the receive optic 44. As a result, there is a space 64 between the fields of view 60 and 62 where objects 52 cannot be seen and detected. Furthermore, problems with ranging spikes can be experienced with respect to region 66 just further than the nearest detectable distance d'. Also, the extreme edge areas 68 of the transmit field of view 60 are susceptible to concerns with poor mode mixing of a multimodal VCSEL output light pulse.

There is a need in the art to address the forgoing problems.

SUMMARY

In an embodiment, a time of flight (TOF) sensor comprises: a transmit integrated circuit including a light source configured to generate a collimated beam of light; a receive integrated circuit including a first photosensor; and a transmit optic mounted over the transmit integrated circuit and the receive integrated circuit, said transmit optic formed by a prismatic light guide configured to receive the beam of light and having an annular body region surrounding a central opening which is aligned with the first photosensor, the annular body region including a first reflective surface defining the central opening and further including a ring-shaped light output surface surrounding the central opening and configured to output light in response to light that propagates within the prismatic light guide in response to the received beam of light and which reflects off the first reflective surface.

In an embodiment, a prismatic light guide receives a beam of light and includes an annular body region surrounding a central opening. The annular body region of the prismatic light guide includes a first reflective surface defining the central opening and further includes a ring-shaped light output surface surrounding the central opening and configured to output light in response to light that propagates within the prismatic light guide in response to the received beam of light and which reflects off the first reflective surface.

BRIEF DESCRIPTION OF THE DRAWINGS

For a better understanding of the embodiments, reference will now be made by way of example only to the accompanying figures in which.

DETAILED DESCRIPTION

Figure 1:
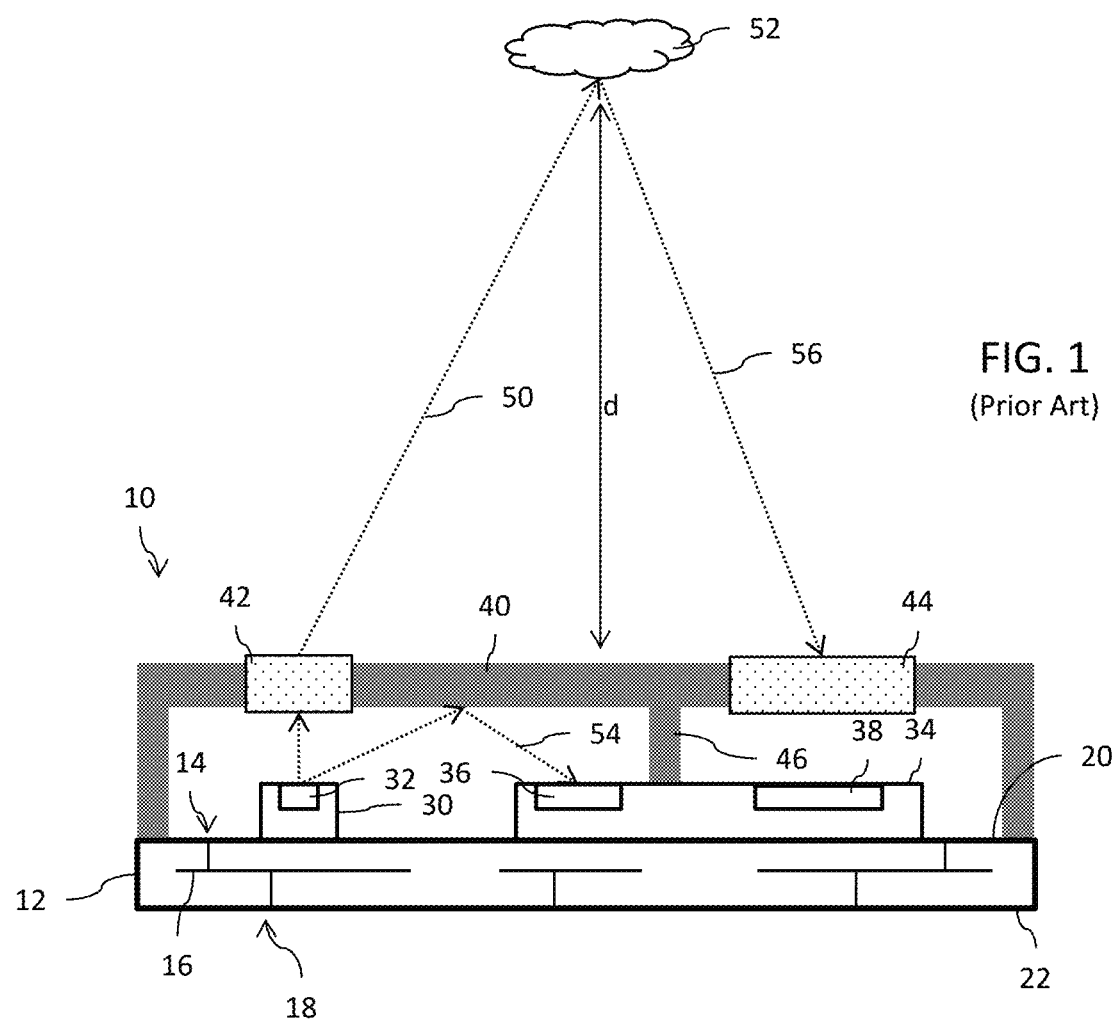
FIG. 1 is a cross-sectional view of a typical prior art TOF sensor.
Figure 2:
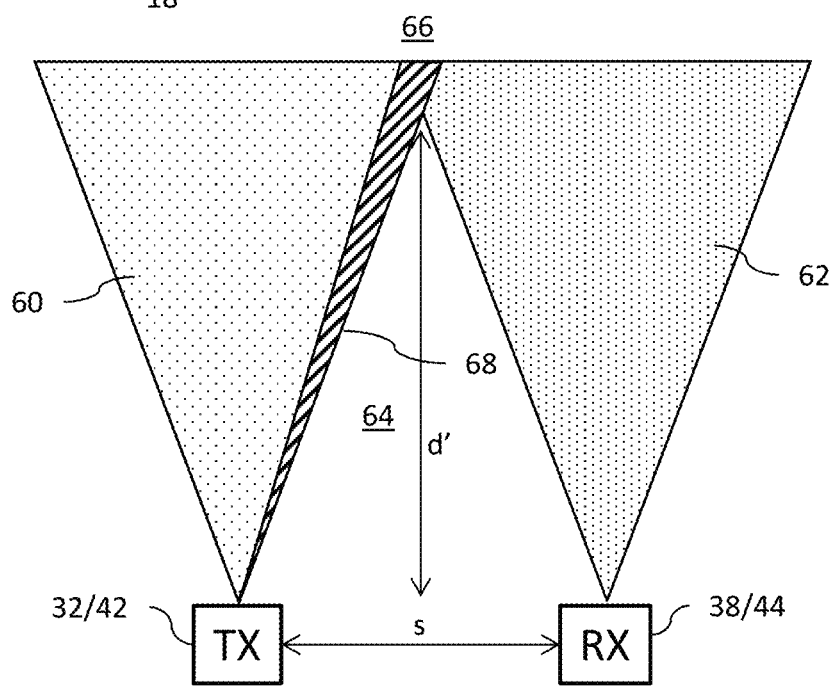
FIG. 2 illustrates parallax concerns with the sensor of FIG. 1.
Figure 3A:
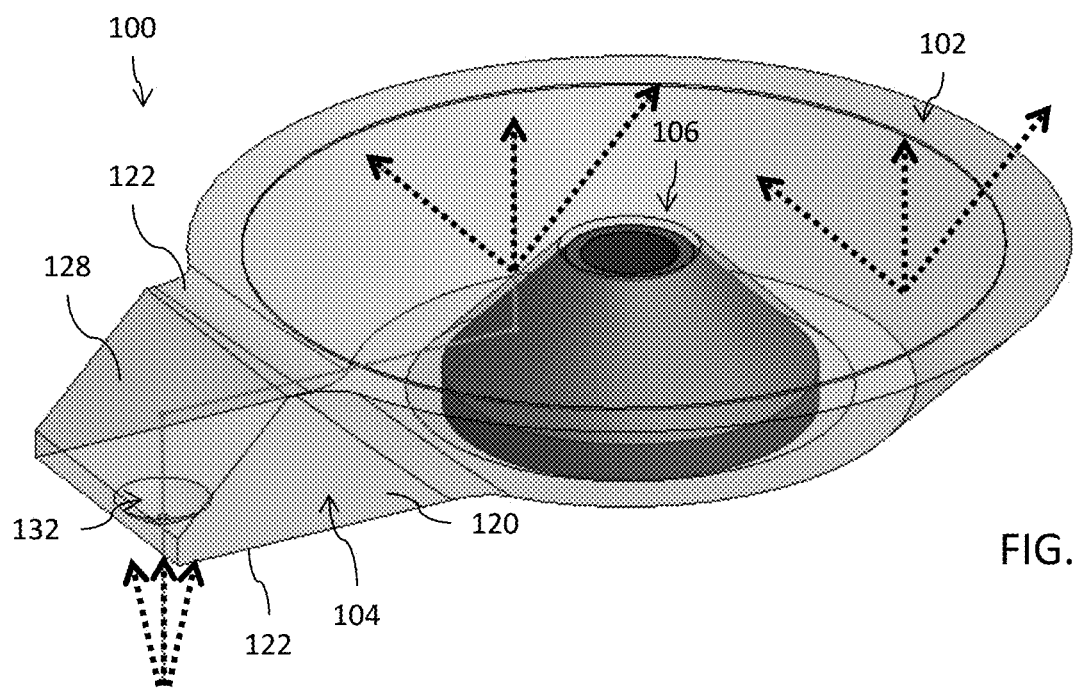
FIGS. 3A-3B show isometric and partially transparent views of a transmit optic.
Figure 3B:
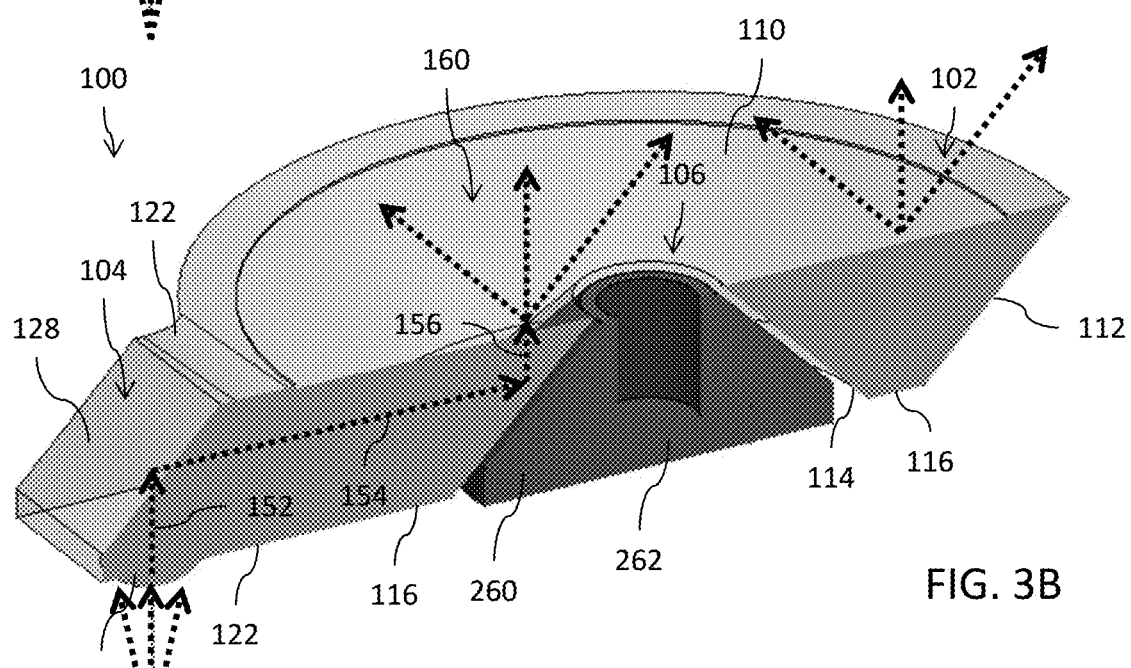

Reference is now made to FIG. 3A which shows an isometric and partially transparent view of a transmit optic 100 for use in a time of flight (TOF) sensor. FIG. 3B shows a cross-section of the isometric and partially transparent view of FIG. 3A. The transmit optic 100 is a prismatic light guide formed by a unitary body of highly optically transparent material such as polycarbonate or poly methyl methylacrylate (PMMA). The unitary body of the transmit optic 100 is preferably made using an injection molding process followed by optical finishing of external surfaces in a manner well known to those skilled in the art. Furthermore, certain external surfaces of the molded unitary body which are desired to be reflective may be treated with a mirror coating in manner well known to those skilled in the art.

Figure 3C:
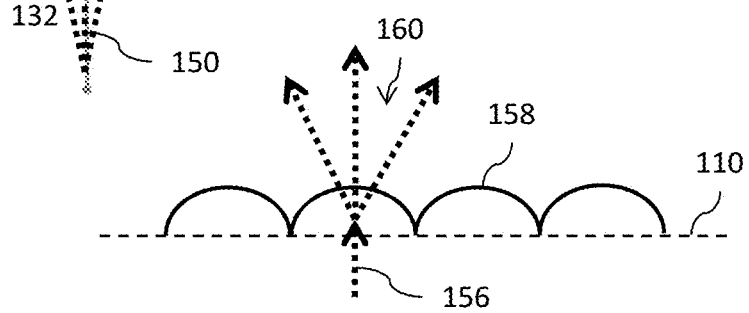
FIG. 3C is a cross-section of a microlens structure.

The unitary body of the transmit optic 100 includes an annular body region 102 and a radial projection region 104. The annular body region 102 is in the form of a ring which encircles a central opening 106 and has a radial cross-section in the general shape of a trapezoid where the longer side of the two parallel sides of the trapezoidal cross-section defines a light outlet surface 110 of the transmit optic 100. The light outlet surface 110 is ring-shaped (in a plane perpendicular to an axis of the central opening and is preferably textured and/or patterned to include a plurality of microlens 158 structures (for example, convex in cross-section as shown in FIG. 3C), wherein each microlens 158 may have a size and shape as needed in order to produce a desired beam divergence (reference 160). With this annual body region configuration, the central opening 106 takes the shape of a truncated cone (i.e., it is frusto-conical in shape). The outer and inner non-parallel sides of the trapezoidal cross-section respectively define angled light reflecting surfaces 112 and 114 (more specifically, internally light reflecting surfaces) which may, for example, have a mirror coating for reflection or be configured as total internal reflection surfaces. The shorter side of the two parallel sides of the trapezoidal cross-section defines part of a base surface 116 of the transmit optic 100, and as will be described in more detail herein a portion of this base surface provides the light input surface of the transmit optic 100. The base surface 116 may further be treated to be reflective (for example, by use of a mirror coating layer).

The radial projection region 104 extends in a radial direction out from the annular body region 102. The radial projection region 104 may have a cross-section perpendicular to the radial direction in the general shape of a rectangle or square. A first pair of opposed parallel sides 120 of the rectangular or square cross-section are extensions of the outer non-parallel side of the trapezoidal cross-section for the annular body region 102 associated with the reflecting surface 112. A second pair of opposed parallel sides 122 of the rectangular or square cross-section are extensions of the light outlet surface 110 and base surface 116. The distal end of the radial projection region 104 includes an angled light reflecting surface 128 (more specifically, an internally light reflecting surface) which may, for example, have a mirror coating for reflection or be configured as a total internal reflection surface. The portion of the base surface 116 associated with the parallel side 122 in the radial projection region 104 is shaped to include a collimating optical lens 132 whose optical axis is aligned to intersect at the angled light reflecting surface 128.

The collimating optical lens 132 receives divergent light 150 emitted from an external light source (not shown) and collimates the received external light to produce a beam 152 directed towards the angled light reflecting surface 128. The beam 152 is reflected by the angled light reflecting surface 128 to produce a beam 154 which propagates through the radial projection region 104 generally in a radial direction towards the central opening 106. The beam 154 is reflected by the reflecting surface 114 to produce a beam 156 directed towards the light outlet surface 110 and the plurality of microlens 158 structures. The microlens 158 structures refract the beam 156 to produce a spread of beams 160. It will be understood, even though not explicitly illustrated in FIG. 3B, that portions of the beam 154 will in effect spread when propagating through the radial projection region 104 and could bounce of other surfaces of the prismatic light guide before reaching the microlens 158 structures. The illustrated paths for beams 154, 156 and 160 is just one example of light propagation within the prismatic light guide of the transmit optic 100. Illumination from the received collimated light 150 will be output across the light outlet surface 110 at locations which surround the central opening 106.

Figure 4A:
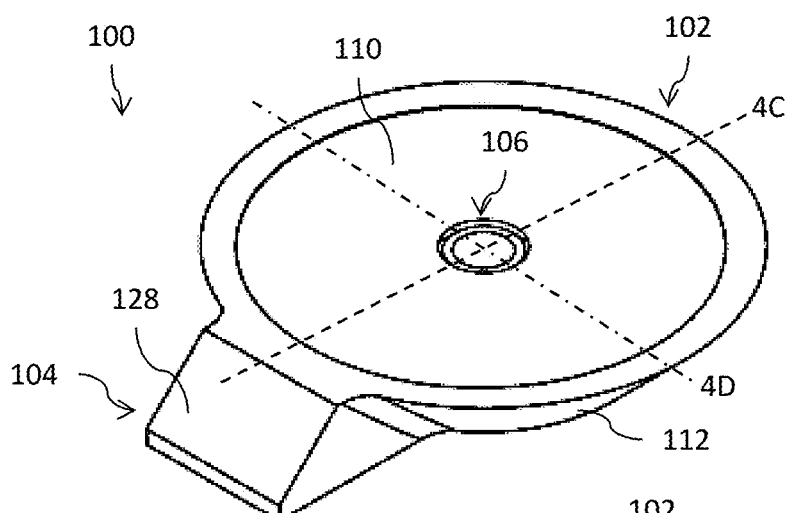
FIGS. 4A-4B are top and bottom perspective views of the transmit optic.
Figure 4B:
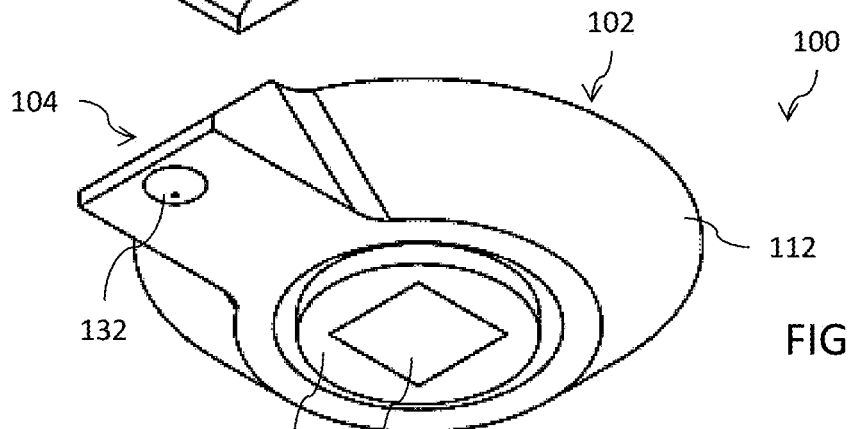
Figure 4C:
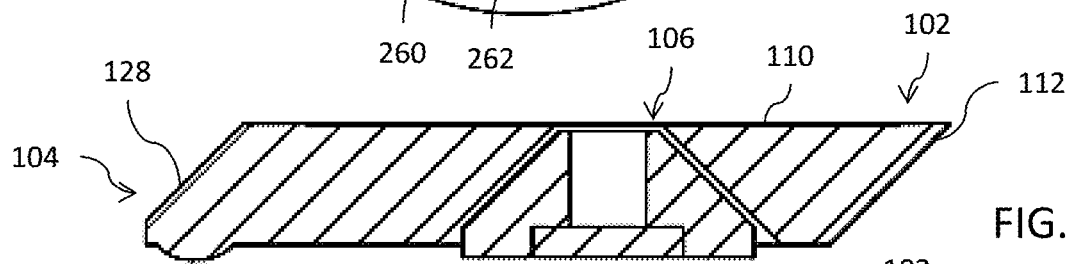
FIGS. 4C-4D are cross-sectional views of the transmit optic.
Figure 4D:
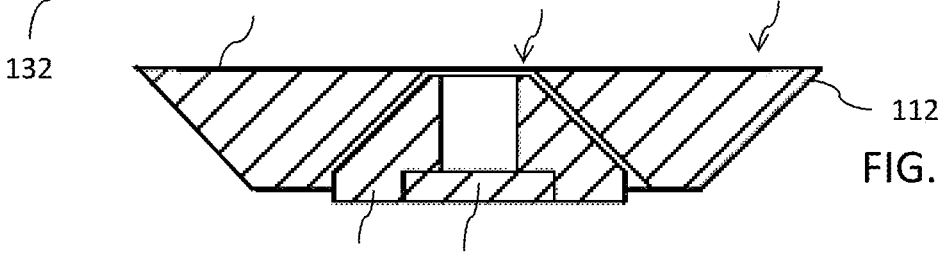
Figure 4E:
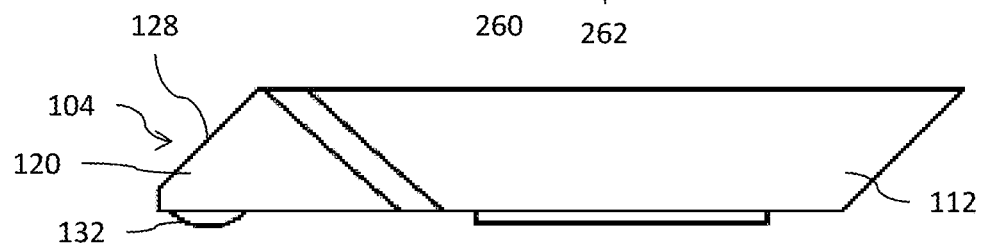
FIG. 4E is a side view of the transmit optic.

FIGS. 4A-4B are top and bottom perspective views of the transmit optic 100, FIGS. 4C-4D are cross-sectional views of the transmit optic 100 taken along lines 4C and 4D, respectively, of FIG. 4A, and FIG. 4E is a side view of the transmit optic 100.

Figure 5:
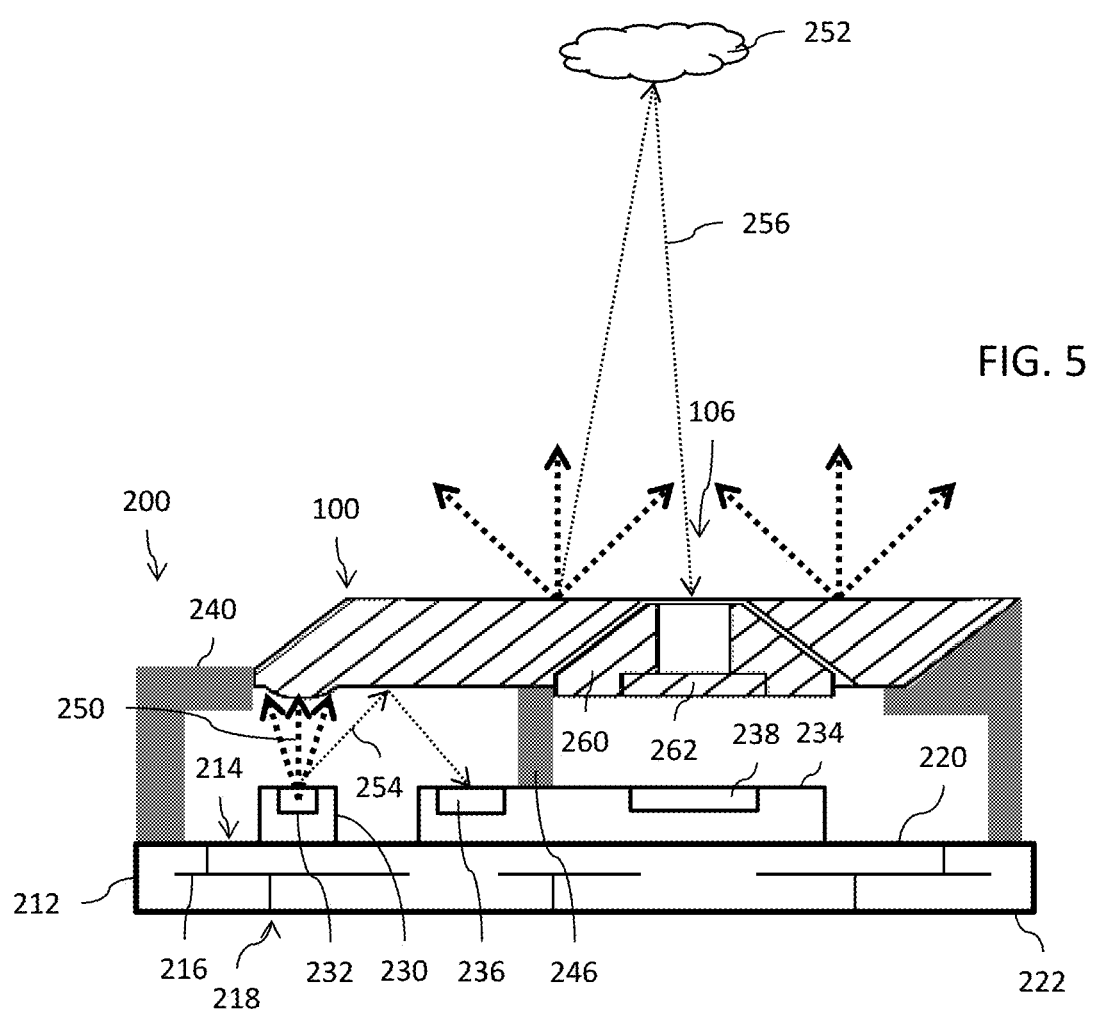
FIG. 5 is a cross-sectional view of a TOF sensor incorporating the transmit optic.

Reference is now made to FIG. 5 which presents a cross-sectional view of a TOF sensor 200 that utilizes the transmit optic 100. The sensor includes a support substrate 212 which may include interconnection wiring 214, 216, 218 that is embedded within the substrate 212 and further located on the front surface 220 and rear surface 222 of the substrate. The wiring 216 within the substrate serves to interconnect the wiring 214 on the front surface 220 to the wiring 218 on the rear surface 222. A transmitter integrated circuit chip 230 is mounted to the front surface 220 of the substrate 212 and electrically connected to the wiring 214 (using bonding wires or other electrical connection means well known to those skilled in the art). The transmitter integrated circuit chip 230 includes a light source 232 (for example, a vertical-cavity surface-emitting laser (VCSEL)). A receiver integrated circuit chip 234 is also mounted to the front surface 220 of the substrate 212 and electrically connected to the wiring 214 (using bonding wires or other electrical connection means well known to those skilled in the art). The receiver integrated circuit chip 234 includes a first photosensor 236 and a second photosensor 238. The photosensors 236, 238 may, for example, each comprise an array of single-photon avalanche diodes (SPADs). The first photosensor 236 functions as a reference signal detector and the second photosensor 238 functions as an object signal detector. The integrated circuit chips 230 and 234 are enclosed in an opaque housing 240 that is mounted to the front surface 220 of the substrate 212. The housing 240 supports the transmit optic 100 with the collimating lens 132 aligned with the light source 232 and the central opening 106 aligned with the second photosensor 238. An adhesive may be used to mount the transmit optic 100 to the housing 240. A central partition 246 of the housing 240 is positioned between the first photosensor 236 and the second photosensor 238 to function as a light isolation barrier.

A light pipe 260 with a receive optic 262 (for example, a transparent plate) is mounted within the central opening 106. The light pipe has the shape of a truncated cone (i.e., frusto-conical) with a central bore within which the receive optic 262 is installed. The outer conical surface of the light pipe 260 may be adhesively bonded to the inner conical surface 114 transmit optic 100. The light pipe may be made of an optically opaque molded material.

Operation of the TOF sensor 200 involves triggering the emission of a pulse of light by the light source 232. A first portion 250 of the emitted light forms the divergent light 150 which is directed towards the collimating lens 132 and passes through the transmit optic 100 to be emitted from the light outlet surface 110 as the spread of beams 160 which are directed toward an object 252. A second portion 254 of the emitted light is reflected by the base surface 116 of the transmit optic 100 and is detected by the first photosensor 236. The first portion 250 of the emitted light reflects from the object 252, and the reflected light 256 passes through the light pipe 260 and receive optic 262 and is detected by the second photosensor 238. The difference in time between the detection of the second portion 254 by the first photosensor 236 and the detection of the reflected light 256 by the second photosensor 238 is indicative of the distance d between the TOF sensor 200 and the object 252.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A system, comprising:
    a first optic, comprising:
        an annular body region surrounding a central opening defined by a first reflective surface;
        wherein said annular body region includes a ring-shaped light output surface surrounding the central opening;
        wherein the first reflective surface defining the central opening is conical in shape;
        a radial projection region extending in a radial direction away from the annular body region;
        wherein said radial projection region includes a lower surface and a second reflective surface extending between an extension of the ring-shaped light output surface and the lower surface; and
        a collimating lens located on the lower surface of said radial projection region and having an optical axis aligned to intersect with said second reflective surface; and
    a second optic comprising:
        a light pipe having a bore;
        wherein an outer surface of the light pipe is conical in shape; and
        wherein the light pipe is mounted within the central opening of the annular body region.

2. The system of claim 1, wherein said collimating lens is configured to receive a beam of light and produce a collimated beam of light that is reflected by said first and second reflective surfaces to produce an output beam of light at said ring-shaped light output surface.

3. The system of claim 1, further comprising a plurality of microlenses located on the light output surface.

4. The system of claim 3, wherein each microlens has a convex shape.

5. The system of claim 1, further including an adhesive material for securing the conical outer surface of the light pipe to the conical first reflective surface of the annular body region.

6. The system of claim 1, further comprising:
    a light source configured to generate a beam of light directed towards said collimating lens; and
    a light sensor configured to receive light passing through the bore of the light pipe.

7. The system of claim 1, wherein the conical first reflective surface has a mirror coating.

8. The system of claim 1, further comprising a light source configured to generate a beam of light directed towards said collimating lens.

9. A system, comprising:
    a first optic formed by a prismatic light guide, wherein said prismatic light guide comprises:
        an annular body region surrounding a central opening;
        a radial projection region extending in a radial direction away from the annular body region, wherein a surface of the radial projection region includes a collimating lens configured to receive a beam of light and produce a collimated beam of light;
        the annular body region including a first reflective surface defining the central opening and configured to internally reflect the collimated beam of light; and
        a light output surface surrounding the central opening in a ring-shape and configured to output light in response to the internally reflected collimated beam of light; and
    a second optic comprising:
        a light pipe having a bore;
        wherein the light pipe is mounted within the central opening of the annular body region.

10. The system of claim 9, wherein the radial projection region further includes a second reflecting surface configured to internally reflect the collimated beam of light through the radial projection region and towards the first reflecting surface.

11. The system of claim 10, wherein an optical axis of the collimating lens is aligned to intersect with the second reflecting surface.

12. The system of claim 10, wherein the beam of light is divergent and where the collimating lens is configured to collimate the divergent beam of light to provide the collimated beam of light.

13. The system of claim 10, wherein the collimated beam of light propagates, after being internally reflected by the second reflecting surface, through the prismatic light guide in a direction parallel to said radial direction and is reflected by the first reflective surface towards the light output surface.

14. The system of claim 13, wherein the first reflective surface is a conical surface.

15. The system of claim 9, wherein the light output surface includes a plurality of microlenses.

16. The system of claim 15, wherein each microlens has a convex shape.

17. The system of claim 9, wherein the first reflective surface is a conical surface and wherein an outer surface of the light pipe is conical in shape.

18. The system of claim 17, further including an adhesive material for securing the conical outer surface of the light pipe to the conical first reflective surface of the annular body region.

19. The system of claim 9, further comprising:
    a light source configured to generate said beam of light directed towards said collimating lens; and
    a light sensor configured to receive light passing through the bore of the light pipe.

20. The system of claim 9, wherein the first reflective surface has a mirror coating.

21. The system of claim 9, further comprising a light source configured to generate said beam of light directed towards said collimating lens.

22. A system, comprising:
a prismatic light guide comprising:
an annular body region surrounding a conical central opening passing completely through the annular body region, the annular body region including a first reflective surface defined by the conical central opening and further including a ring-shaped light output surface surrounding the conical central opening;
wherein said first reflective surface is configured to internally reflect light propagating within the prismatic light guide towards said ring-shaped light output surface; and
wherein said prismatic light guide includes a light input surface configured to receive a beam of light; and
a light pipe having a bore, wherein the light pipe is mounted within the conical central opening of the annular body region.

23. The system of claim 22, wherein the ring-shaped light output surface includes a plurality of microlenses.

24. The system of claim 23, wherein each microlens has a convex shape.

25. The system of claim 22, wherein the first reflective surface has a mirror coating.

26. The system of claim 22, wherein said prismatic light guide further comprises a radial projection region extending in a radial direction away from the annular body region.

27. The system of claim 22, wherein the light input surface is defined by a collimating lens.

28. The system of claim 26, wherein the radial projection region further includes a second reflecting surface, wherein said light propagating within the prismatic light guide is reflected by the second reflecting surface in a direction towards the first reflecting surface.

29. The system of claim 28, wherein the light input surface is defined by a collimating lens, and wherein an optical axis of the collimating lens is aligned to intersect with the second reflecting surface.

\* \* \* \* \*